United States Patent
Drost et al.

(10) Patent No.: US 8,014,113 B2
(45) Date of Patent: Sep. 6, 2011

(54) PROTECTION FOR PROXIMITY ELECTRONICS AGAINST ELECTROSTATIC DISCHARGE

(75) Inventors: Robert J. Drost, Los Altos, CA (US); Scott M. Fairbanks, Corvallis, OR (US); Alex Chow, East Palo Alto, CA (US)

(73) Assignee: Oracle America, Inc., Redwood Shores, CA (US)

( * ) Notice: Subject to any disclaimer, the term of this patent is extended or adjusted under 35 U.S.C. 154(b) by 699 days.

(21) Appl. No.: 12/144,142

(22) Filed: Jun. 23, 2008

(65) Prior Publication Data

US 2009/0315157 A1  Dec. 24, 2009

(51) Int. Cl.
*H02H 9/00* (2006.01)
*H02H 1/00* (2006.01)
*H02H 1/04* (2006.01)
*H02H 3/22* (2006.01)
*H02H 9/06* (2006.01)

(52) U.S. Cl. .......................................... 361/56; 361/118
(58) Field of Classification Search ..................... 361/56
See application file for complete search history.

(56) References Cited

U.S. PATENT DOCUMENTS 6,493,198 B1 * 12/2002 Arledge et al. .................. 361/56
6,734,504 B1 *  5/2004 Lie et al. ........................ 257/355

* cited by examiner

*Primary Examiner* — Dharti H Patel
(74) *Attorney, Agent, or Firm* — Park, Vaughan, Fleming & Dowler LLP

(57) ABSTRACT

A system of protecting a proximity communication system against electrostatic discharge (ESD). The proximity communication system includes two chips, each having an array of electrical pads at its surface and covered by a thin dielectric layer such that capacitive coupling circuits are formed between the chips when they are joined together. In at least one of the chips, an additional protection pad is formed away from the array, and heavy protection circuitry is connected to it. Its surface is exposed through the dielectric surface over it such that, when an ESD aggressor approaches, the discharge occurs to the protection pad.

15 Claims, 2 Drawing Sheets

PROTECTION FOR PROXIMITY ELECTRONICS AGAINST ELECTROSTATIC DISCHARGE

BACKGROUND

1. Field of the Invention

This invention relates generally to protection of electronic systems against electrostatic discharge. The invention relates specifically to electronic means for protecting communication pads covered by a dielectric layer as is used in proximity communication systems.

2. Related Art

Proximity communication is an I/O technology that allows two chips in face-to-face alignment to communicate without wires, as Drost et al. have explained in "Proximity Communication," *IEEE Journal of Solid-State Circuits*, vol. 39, no. 9, September 2004, pp. 1529-1535. In the most widely used implementation, corresponding arrays of electrode plates or pads are formed in the opposing surfaces of the two chips, which are then fixed together with a dielectric layer in between to form a large number of capacitively coupled links between the chips. The pads are electrically conductive and typically formed of a metal. An exemplary structure illustrated in the cross-sectional view of FIG. 1 includes an upper chip 12 and a lower chip 14 having respective electrical pads 16, 18 formed in their active surfaces. Although only one pair of pads 16, 18 is shown, a proximity communication system typically includes a large number of paired pads 16, 18 closely packed in a one- or two-dimensional array. Respective thin dielectric layers 19, 20 cover the active surfaces of the chips 12, 14 and their pads 16, 18. The dielectric layers 19, 20 may be conventional passivation layers covering an integrated circuit. The chips 12, 14 are brought into juxtaposition such that the pads 16, 18 face each other and form between them a capacitor having the intermediate dielectric layers 19, 20 acting as the gap of the capacitor. This structure provides a capacitive coupling circuit between the chips 12, 14. A driver 22 in the upper chip 12 is connected to its pad 16 and impresses an electrical data signal on the pad 16. A receiver 24 in the lower chip 14 is connected to its pad 18 and senses an electrical data signal impressed on the pad 18 from the other pad 16. Proximity communication is particularly effective in being able to provide a large number of paired pads in closely spaced one- and two-dimensional arrays to provide a wide communication bus between the chips 12, 14. The communication bus may operate in different directions for different paired pads.

Electrostatic discharge (ESD) is a well known effect in which electrical charge arising from extraneous sources is somehow impressed on electronic circuitry and may induce signal levels which the circuitry is not designed to withstand. ESD events have the potential to destroy transistors or other chip elements connected to a proximity communication pad. The conventional method of protecting against ESD events would be to add a parallel path that could dissipate the energy of an ESD event within a few nanoseconds, and hence protect sensitive circuit elements, acting akin to a lightning rod on a building. Unfortunately, this approach is impractical for proximity communications because it would add so much parasitic capacitance to the critical proximity pad that the received signal would be unacceptably attenuated.

The signal levels of proximity communication systems are very low, and the sensitive circuitry used to detect these levels may be prone to ESD failure. However, the magnitude of electrostatic discharge in capacitively coupled proximity communication has not been quantified, and solutions to ESD have not been widely promulgated.

SUMMARY

One aspect of the present invention provides a proximity communication system that is less prone to failure from electrostatic discharge.

In one embodiment, proximity communication pads are covered by a thin dielectric layer, also called overglass, but a similar attractor pad is formed away from the proximity pads and an aperture is formed in the overglass over the attractor.

In some embodiments, a strong ESD handling circuit is connected to the attactor pad to sink large electrostatic currents.

In some embodiments, weak ESD handling circuits are connected to the proximity pads in tandem with sensitive circuitry such as receivers to sink relatively small electrostatic currents without severely affecting the performance of the sensitive circuits.

In some embodiments, the two adjoined proximity communication chips include respective exposed attractor pads that are aligned between the chips. As a result, when the chips are assembled, the electrostatic charge is likely to drain from one attractor pad to the other.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein.

In proximity communication, the risk of electrostatic discharge (ESD) on proximity communication pads is different but not eliminated versus that of conventional conductive communication channels involving wire bonding or ball bonding. The difference arises at least in part from the overglass or dielectric layer that covers proximity pads. The size, and hence parasitic loading, of proximity pad structures exposed to ESD will be determined given the risk mitigation from the overglass protection. A second ESD failure mode for proximity communication pads will be investigated. This failure mode occurs when the glass covering the proximity pad experiences dielectric breakdown. This second mode would set a limit to the magnitude of ESD voltages which could be tolerated. However, a novel ESD protection structure to be described eliminates the second failure mode while avoiding adding any parasitic capacitance to the critical signal path.

Figure 2:
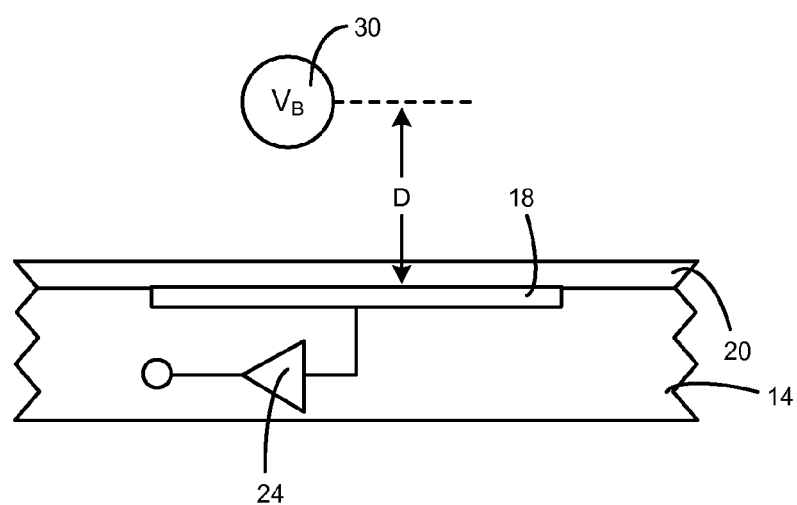
FIG. 2 is a schematic cross-sectional view illustrating the mechanism of one mode of electrostatic discharge upon a chip intended to form part of a proximity communication system.

We believe that the most likely source of ESD, as illustrated in the cross-sectional view of FIG. 2, is from a charged body 30 charged to a voltage $V_B$ and rapidly approaching the proximity pad 18, as might occur when the chip 14 is being handled prior to being joined to a mating chip. The charged body 30 capacitively couples a large voltage onto the pad 18, potentially breaking down the gate oxide of the transistors in the receiver 24 and destroying those devices. There are circuit models used to represent typical ESD-strikes in the Human Body Model (HBM), the Machine Model (MM), and the Charged-Device Model (CDM). These circuit models inadequately model the ESD strike for proximity communication systems because they assume rapid transfer of charge (in less than a nanosecond) of the charge from the ESD aggressor to the victim.

The model of rapid charge transfer appears to be a good model when the charged body of the aggressor is able to directly contact the victim device. In the case of a proximity pad, physical contact is not made between the charged body and the proximity pad. Instead, a 1 to 2 μm thick layer 20 of glass and possible passivation layers shield the pad 18 in a proximity communication channel. Although this insulator prevents direct physical contact between the aggressor and the victim, it only mitigates the ESD risks because dangerously high voltages can still be capacitively coupled onto the proximity pad 18 and because the insulating layer 20 may break down and allow the high voltage to conductively connect to the proximity pad 18.

The amount of charge Q coupled onto the pad depends upon the capacitance C and potential V between the charged body 30 and the pad 18 according to $$Q = CV.$$

Neglecting fringe fields, the capacitance C is inversely proportional to the distance d between the pad 18 and the approaching body 30 according to $$C = \frac{\varepsilon A}{d},$$

where A is the area of the pad 18 and $\varepsilon$ is the permittivity between the pad 18 and the approaching charged body 30.

This equation is accurate if the lateral dimensions of the pad 18 are greater than the separation d; otherwise, it underestimates the actual capacitance because of the fringe fields. In fact, it predicts that the capacitance goes to zero as d increases to infinity, whereas the capacitance approaches a lower bound due to unavoidable fringing to the background environment which yields a lower bound for self capacitance of $8 \cdot \varepsilon \cdot a$ for a thin disk of radius a. However, if the ESD attacker object 30 approaches the chip 14 at a constant velocity, then the maximum capacitance and maximum rate of change of that capacitance will occur just before the object touches the chip 14. In this case, the pad 18 may have lateral dimensions on the order of 20 to 50 microns, whereas the distance d is around 2 to 5 microns, and the parallel plate approximation is reasonable.

The calculations are simplified if it is assumed that the pad 18 and its overglass 20 and the charged ESD body 30 were initially far apart and move together at a constant relative velocity v, touching at a time t=0. The distance d between the pad 18 and the charged body 30 as a function of time t is then $$d = -v \cdot t + d_i,$$

where $d_i$ is the thickness of the dielectric layer 20. Combining the last two equations yields $$Q = \frac{\varepsilon \cdot A \cdot V}{-v \cdot t + d_i}.$$

An important value is the maximum current that must be removed through the transistorized circuitry to protect against ESD failure. The assumption that the receiver 24 must remove the capacitively induced current without any change in the receiver signal voltage maximizes the induced current. The current coupled onto the pad 18 is the time differential of the charge $$I = \frac{dQ}{dt} = \frac{d}{dt}\left(\frac{\varepsilon \cdot A \cdot V}{-v \cdot t + d_i}\right).$$

For constant velocity v and voltage V, this reduces to $$I = \frac{\varepsilon \cdot A \cdot V \cdot v}{v^2 \cdot t^2 - 2 d_i \cdot v \cdot t + d_i^2}.$$

The maximum current $I_{max}$ occurs at t=0 so that $$I_{max} = \frac{\varepsilon \cdot A \cdot V \cdot v}{d_i^2}.$$

The maximum current $I_{max}$ can be calculated based upon the following values. The permittivity for maximum current is that of the dielectric layers encountered at impact. The relative permittivity of glass is only 4.2 while that of the passivation material is 8. For simplicity, the relative passivation value of 4.2 normalized to the vacuum value of 8.85 pF/m will be used. The thickness $d_i$ of the dielectric layer is typically about 1.5 microns. The area of the pad is likely to be 22 microns on a side. The low end of the potential of the charged body for Class 2 HBM certification is 2 kV. The speed of sound in air is approximately 344 m/s. If it is assumed that the assembly robots and technicians producing the charged body move at less than a tenth of the speed of sound, the maximum velocity v is about 34.4 m/s. With these values, $I_{max}$ is about 1 mA.

The receiver pad will likely connect to the diffusion region of at least one transistor. If the voltage on the transistor input pin exceeds a threshold voltage of either rail, then the diode formed by the interface between the diffusion and body or well will either forward bias for a voltage of around 0.7 volts past the positive or negative supply or suffer reverse breakdown for 3 to 5 volts past the positive or negative supply. For I/O pads exposed to air, the ESD circuits must typically handle peak currents in the multiple ampere range, leading to the requirement for wide transistors with many vias and wide metal interconnect paths. In the case of proximity communication described above, the maximum current of 1 mA can be easily accommodated by a single via, minimum transistor width, and minimum wire width.

How many microns of transistor diffusion will likely be attached to the receiver pad? From a perspective of signal strength, a minimum lateral width of the diffusion is desired in order to reduce the area of the junction and the current across it. On the other hand, the pad will need to be biased, which guarantees at least one minimum width transistor, which is about 0.5 μm wide in a 0.18 μm technology. There will possibly also be some offset compensation circuitry which guarantees at least another minimum width transistor, bringing a total of 1 µm of transistor on the pad which should be able to conduct away about 1 mA of current once the drain potential rises or falls to turn on the diffusion diode to substrate.

If the progressive-approach capacitive-coupling model discussed so far held all the way until a probe touched a pad conductively, then conventional pads that are exposed to air would have similar times as proximity communication to dissipate an ESD event. But it is known that this is not the case. ESD events for conventional conductive pads place the full ESD strike in less than a nanosecond. What is different for conventional pads?

The ESD slow-approach quandary is solved by considering dielectric strength. Dielectric strength provides a measure of the maximum electric field strength that a dielectric layer can support before it breaks down and ionizes. This dielectric failure provides a conductive connection through the dielectric insulator. Air breaks down in an electric field of about 3V/µm. In contrast, silicon dioxide ($SiO_2$) and silicon nitride ($Si_3N_4$), the typical composition of the top passivation layer of chips, both have dielectric strengths on the order of 1000V/µm. As a result, as an ESD aggressor approaches a chip pad, if the ESD voltage is 3000V when it is somewhere around a distance of 1 mm away from the pad, the air between the pad and the ESD object breaks down, thereby causing a sub-nanosecond transfer of charge onto the pad.

Initially, a blanket assumption was made that the glass-covered pads were in fact immune to ESD events. However, it was then realized that external conductors with static voltages could capacitively couple voltages of one-half to one-third of the value of the ESD-body voltage onto a proximity pad if the chips touch. Hence, a 10,000 volt ESD-charge conductor could still couple 3000 to 5000 volts onto a proximity pad. The analysis contained herein shows that the choice to cover in glass was fortuitous; it not only provides greater capacitive coupling than air for signal propagation, but additionally it allows a minimum of transistor diffusion to fully handle typical ESD events by preventing the long-distance spark-breakdown that causes the introduction of ESD-level voltages on the time scale of less than a nanosecond onto exposed conductively-coupled (conventional) pads.

Unfortunately, the overglass insulator on proximity pads is not immune to dielectric breakdown. For instance a 10,000 volt ESD object resting on a 2 µm thick overglass would create an electric field of 5000V/µm. This field exceeds the dielectric strength of a typical insulator and would cause breakdown and hence a spark and sub-nanosecond transfer of charge.

Laboratory work tends to be careful and thus probably avoids chips with 5 or 10 kV ESD events. However, the high-end of standards for ESD machine, body, and charged-device models permit specification of such high numbers. It is certainly preferable to be able to certify that the specified proximity communication circuits can handle such challenging manufacturing, assembly, and test environments.

Hereafter is described a new idea of proximity ESD attractor pads that achieves the desired performance.

Figure 1:
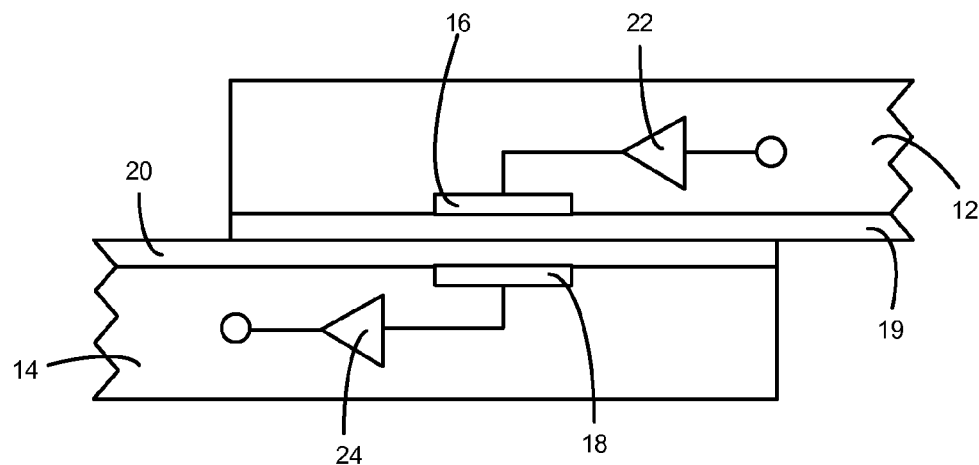
FIG. 1 is a schematic cross-sectional view illustrating a capacitively coupled proximity communication system.
Figure 3:
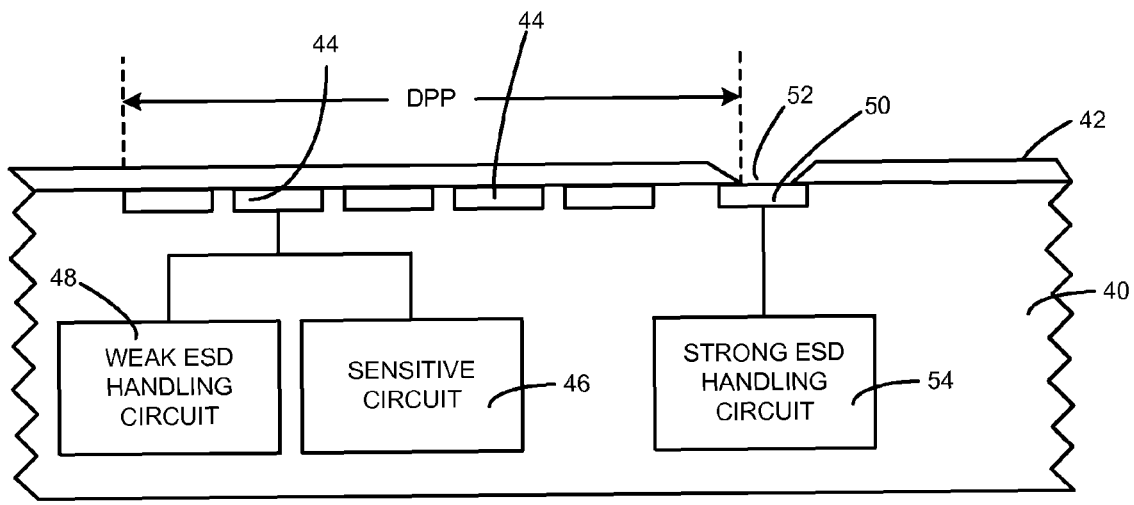
FIG. 3 is a schematic cross-sectional view illustrating an embodiment of the invention for protecting proximity communications from electrostatic discharge.

As shown in the schematic cross-sectional view of FIG. 3, a chip 40 includes an array of multiple proximity pads 44 covered by an insulating layer 42, preferably a glassy dielectric. Each of the proximity pads 44 forms part of a proximity communication channel and is typically connected to circuitry formed in the chip 40 to process that channel. Some of the circuitry associated with respective ones of the proximity pads 44 may be a sensitive circuit 46, such as the receiver 24 of FIG. 1. It may be desirable to associate a weak ESD handling circuit 48 with each sensitive circuit 46 to allow weak ESD events to be dissipated close to the sensitive circuit 46 without permanently affecting the associated sensitive circuit 46. Haselof describes examples of ESD protection circuits in "Latch-Up, ESD, and Other Phenomena," *Application Report*, SLYA014A, pp. 14, 15 (Texas Instruments, May 2000). Simple weak ESD handling circuits may include clamping diodes, such as Zener diodes connected from the input or output to the voltage rails. These limit the impressed voltage and conduct excess current away from the sensitive circuits. Stronger ESD handling circuits may include larger diodes, multiple stages, and optional transistors to provide bipolar protection.

Additional circuitry may be provided to handle strong ESD events. An attractor pad 50 is formed in the surface of the chip 40 away from the array of proximity pads 44. The attractor pad 50 may be formed at the same time as the proximity pads 44 and have the same composition and thickness although its lateral extent may be freely chosen. When the insulating layer 42 is deposited, it is additionally patterned to form an aperture 52 overlying at least a portion of the attractor pad 50. The aperture 52 extends all or part way through the insulating layer 42. With a through aperture, air extends to the attractor pad 50. A strong ESD handling circuit 54 is connected to the attractor pad 50 and is designed to dissipate a large ESD event.

If an ESD aggressor approaches the proximity pads 44 and if ESD voltage would have been high enough to break down the overglass 42 over the closest proximity pad 44, the ESD voltage will instead first break down the all-air path to the ESD attractor pad 50. This breakdown event may reduce the voltage to a level so that if the probe continues approaching the proximity pads 44 and eventually rests against their overglass 42, then the ESD probe voltage will no longer break down the overglass 42 or will at least be a small enough voltage that the weak ESD handling circuit 48 can handle it. Hence, the diversion of the ESD voltage to the attractor pad 50 will protect the proximity pad 44 and its associated sensitive circuit 46.

The strong ESD handling circuit 54 associated with the attractor pad 50 can be large and competently capable of sinking current from an ESD aggressor charged to many thousands of volts because the protecting attraction pads 50 are not on the critical signal path. Since its pad 50 is not coupled to a sensitive circuit, the strong ESD handling circuit 54 can be designed for large currents and low impedances. One example of a simple strong ESD handling circuit is a conductive line to ground or other power supply rail, perhaps including a small resistance to limit current in the line. A stronger design includes two attractor pads connected by respective conductive lines to the two power rails.

However, the ESD attractor pads 50 may not remove all voltage from the ESD aggressor. This implies that a distance $D_{pp}$ between the attractor pad 50 and the sensitive wires and circuits 46 has an upper limit. In the worst case, the dielectric breakdown to the proximity ESD attractor pad 50 may stop immediately after the ESD aggressor voltage has dropped enough to reduce the electric field below the dielectric strength limit of the overglass 42. The remaining ESD voltage must be accommodated by the overglass and the small diffusion regions attached to the proximity pads 44. From the perspective of capacitively induced current, we have seen that the diffusion regions can accommodate high ESD voltages. However, the overglass dielectric breakdown avoidance requires lower residual ESD voltages. For instance, if the overglass 42 is 1.5 µm thick, then a 1000 V/µm dielectric strength is consistent with a residual ESD voltage limit of 1500V. However dielectric strengths can vary a bit. A safety margin of a factor of two would imply a residual ESD voltage limit of around 750V. The assumption that the proximity ESD attractor pads 50 reduce the ESD aggressor voltage to that set by the dielectric strength of air, 3V/µm, implies that any proximity pad should be at most 250 microns away from the nearest ESD attractor pad 50. This separation allows protection for a large number of closely packed proximity pads from the nearest attractor pad.

The maximum distance, $Dpp_{max}$, can be related to a given passivation thickness, $T_{pass}$, a given passivation dielectric strength, $DS_{pass}$, and the usual dielectric strength of air, $DS_{air}$, by the equation $$Dpp_{max} = T_{pass} * \frac{DS_{pass}}{DS_{air}}.$$

This equation needs to be modified if a residual thickness of the glass or some other dielectric layer remains over the attractor pad 50. Most metals form a native dielectric oxide of a few nanometers in thickness. Possibly, a thin dielectric layer is left over the attractor pad 50. Generally, however, the residual dielectric thickness in the aperture 52 should be less than 10% of the normal thickness of the overglass 42.

The proximity ESD attractor pads 50 provide the ability to use minimum-size and hence minimum-parasitics transistors on proximity communication pads without suffering the limited ability to accommodate stressful ESD environments.

It is anticipated that the pads connected to receivers are the most sensitive to ESD damage. However, protection is increased if both the receiver pads and the transmit pads are associated with attractor pads and strong ESD handling circuitry.

A beneficial arrangement includes an array of transmit pads on one chip and a corresponding array of receive pads on the other chip. Each array has its own one or more attractor pads arranged in correspondence between the chips. As a result, when the two proximity chips are brought together with the transmit pads of one chip aligned with the receive pads of the other chips, the attractor pads are also aligned between the chips so that the heaviest electrostatic discharge occurs between the paired attractor pads.

Although the above discusses the use of the ESD strike pads for protecting the proximity communication pads, the strike pads can alternatively be used for any glass-covered structures on a chip. Inductively coupled proximity communication systems, optical circuits and devices, micro-electromechanical systems, and other circuit structures fall into this generalized category.

If two chips being brought together have a large relative voltage difference between them, then the ESD attractor pads on the two chips will strike the discharge from one to the other. This is in contrast to a probe or human body model where some exposed conductor that acts as an ESD aggressor is brought toward a single chip. ESD protection is also important in the case of a pair of chips that act as ESD aggressors toward each other. With only glass-covered proximity pads, a voltage difference between chips could otherwise break down the glass covering the proximity pads.

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A first chip configured to be aligned with a corresponding second chip for proximity communication between the chips, comprising:
    a substrate;
    a plurality of conductive first pads formed in the surface of the substrate and connected to respective communication circuitry;
    a conductive second pad formed in the surface of the substrate away from the first pads;
    a dielectric layer formed over the first pads for forming a capacitive gap between pads of the two chips and including an aperture in the dielectric layer over the second pad; and
    discharge handling circuitry coupled to the second pad.

2. The first chip of claim 1, wherein the aperture extends at least 90% through the dielectric layer.

3. The first chip of claim 2, wherein the aperture extends completely through the dielectric layer.

4. The first chip of claim 1, wherein the second pad is separated from any of the first pads by no more than 250 microns.

5. The first chip of claim 1, wherein discharge handling circuitry includes a first conductive path coupling the second pad to a first power supply line in the first chip.

6. The first chip of claim 5, wherein the first chip further comprises:
    a conductive third pad formed in the surface of the substrate away from the first and second pads, wherein a second aperture is formed in the dielectric layer over the third pad; and
    second discharge circuitry including a second conductive path coupling the second pad to a second power supply line in the first chip.

7. The first chip of claim 1, further comprising second discharge handling circuitry which is coupled to the first pads and which is weaker than the discharge handling circuitry coupled to the second pad.

8. A system including the first chip and the second chip of claim 1, wherein the substrate is a first substrate and the second chip includes:
    a second substrate;
    a plurality of conductive third pads formed in the surface of the second substrate in alignment with the first pads when the substrates are juxtaposed,
    a conductive fourth pad formed in the surface of the second substrate in alignment with the second pad when the substrates are juxtaposed and coupled to second communication circuitry; and
    a second dielectric layer formed over the third pads and including a second aperture in the second dielectric layer over the fourth pad.

9. The system of claim 1, wherein a second pad in the plurality of second proximity pads is separated from any of the first pads by no more than 250 microns.

10. The system of claim 1, further comprising discharge handling circuitry which includes a first conductive path coupling a second pad in the plurality of second proximity pads to a first power supply line.

11. A proximity communication system, comprising:
    a first chip including:
        a plurality of first proximity pads formed in a first array at its surface, a plurality of receivers connected to respective ones of the first proximity pads for receiving signals impressed on the first proximity pads, a first attractor pad formed at the surface of the first chip, a first discharge protection circuit coupled to the first attractor pad, and a first dielectric layer formed over the surface of the first chip and covering the first proximity pads but including an aperture over the first attractor pad; and a second chip juxtaposed to the first chip and including a plurality of second proximity pads formed in a second array at its surface in alignment with the first proximity pads for impressing signals on the second proximity pads, and a second dielectric layer formed over the surface of the first chip and covering the second proximity pads, wherein respective pairs of the first and second proximity pads are capacitively coupled across the first and second dielectric layers to provide proximity communication between the first and second chips.

12. The system of claim 11, further comprising a plurality of second discharge protection circuits weaker than the first discharge protection circuit coupled to respective ones of the first proximity pads.

13. The system of claim 11, wherein the second chip includes a second attractor pad formed at its surface in alignment with the first attractor pad and wherein the second dielectric layer includes an aperture over the second attractor pad.

14. The system of claim 11, wherein the aperture extends at least 90% through the dielectric layer.

15. The system of claim 14, wherein the aperture extends completely through the dielectric layer.

* * * * *